United States Patent
Yamada

(10) Patent No.: US 11,740,271 B2
(45) Date of Patent: Aug. 29, 2023

(54) INSULATION RESISTANCE MONITORING DEVICE

(71) Applicant: OMRON Corporation, Kyoto (JP)

(72) Inventor: Tomohiro Yamada, Kusatsu (JP)

(73) Assignee: OMRON CORPORATION, Kyoto (JP)

( * ) Notice: Subject to any disclaimer, the term of this patent is extended or adjusted under 35 U.S.C. 154(b) by 148 days.

(21) Appl. No.: 17/437,231

(22) PCT Filed: Jan. 24, 2020

(86) PCT No.: PCT/JP2020/002570
§ 371 (c)(1),
(2) Date: Sep. 8, 2021

(87) PCT Pub. No.: WO2020/189012
PCT Pub. Date: Sep. 24, 2020

(65) Prior Publication Data
US 2022/0170970 A1    Jun. 2, 2022

(30) Foreign Application Priority Data

Mar. 15, 2019  (JP) .................................. 2019-048909

(51) Int. Cl.
*G01R 31/34* (2020.01)
*G01R 27/02* (2006.01)
*G01R 27/08* (2006.01)

(52) U.S. Cl.
CPC ............ *G01R 27/025* (2013.01); *G01R 27/08* (2013.01); *G01R 31/34* (2013.01)

(58) Field of Classification Search
CPC .. G01R 31/2623; G01R 31/261; G01R 21/06; G01R 19/30; G01R 19/00; G01R 15/144;
(Continued)

(56) References Cited

U.S. PATENT DOCUMENTS

| | | | |
|---|---|---|---|
| 2008/0150549 A1 | 6/2008 | Horikoshi et al. | |
| 2010/0308841 A1* | 12/2010 | Karrer | G01R 27/18 324/123 R |
| 2012/0235824 A1* | 9/2012 | Tu | G01R 31/52 702/65 |

FOREIGN PATENT DOCUMENTS

| | | |
|---|---|---|
| CN | 107064641 A | 8/2017 |
| JP | S60153657 U | 10/1985 |

(Continued)

OTHER PUBLICATIONS

International Search Report for International Application No. PCT/JP2020/002570; dated Mar. 10, 2020.
(Continued)

*Primary Examiner* — Tung X Nguyen
(74) *Attorney, Agent, or Firm* — Cantor Colburn LLP

(57) ABSTRACT

Provided is an insulation resistance monitoring device that enables measurement of insulation resistance using a mega tester without removing the insulation resistance monitoring device. The insulation resistance monitoring device that monitors the insulation resistance of an object to be measured such as a motor includes: a current detecting unit that is connected between the power supply line and the ground line of the motor and detects a current flowing through the insulation resistance of the motor; a voltage generating unit connected between the power supply line and the ground line of the motor; and a switch for opening and closing the connection path between the power supply line or the ground line of the motor and the voltage generating unit, wherein the off resistance when the connection path is opened is 100 MΩ or more.

6 Claims, 2 Drawing Sheets

(58) Field of Classification Search
CPC .......... G01R 15/12; G01R 27/00; G01L 1/10; G01L 1/20; G01L 1/22; G01N 17/00; G01N 27/02; G01N 27/04
See application file for complete search history.

(56) References Cited

FOREIGN PATENT DOCUMENTS

| | | |
|---|---|---|
| JP | 2008157672 A | 7/2008 |
| JP | 2012039796 A | 2/2012 |
| JP | 5942241 B2 | 6/2016 |
| JP | 2017173176 A | 9/2017 |

OTHER PUBLICATIONS

Written Opinion of the International Searching Authority for International Application No. PCT/JP2020/002570; dated Mar. 10, 2020.
JPO Notification of Reasons for Refusal for corresponding JP Application No. 2019-048909; dated Nov. 2, 2021.
EPO Extended European Search Report for corresponding EP Application No. 20774736.1; dated Nov. 23, 2022.
Pickering: "High Voltage Dry Reed Relays": Retrieved from Internet: static.rapidonline.com; XP055981795, Jan. 1, 2019; pp. 1-2.

* cited by examiner

INSULATION RESISTANCE MONITORING DEVICE

CROSS REFERENCE TO RELATED APPLICATIONS

This is the U.S. national stage of application No. PCT/JP2020/002570, filed on Jan. 24, 2020. Priority under 35 U.S.C. § 119(a) and 35 U.S.C. § 365(b) is claimed from Japanese Application No. 2019-048909, filed Mar. 15, 2019, the disclosure of which is also incorporated herein by reference.

TECHNICAL FIELD

The present invention relates to an insulation resistance monitoring device.

BACKGROUND ART

Safety inspections of cubicle-type high-voltage power receiving and transforming equipment and switchboards are required by the Electricity Business Act as legal inspections, and these legal inspections are carried out about once a year. In addition, the business operator conducts a self-inspection of the load of the motor, etc., beyond the switchboard according to its own management standards, and this self-inspection is carried out once a week to once a month.

However, there are a wide variety of management targets in self-inspection, and the reality is that the number is too large to actually handle. Therefore, an insulation resistance monitoring device that automates self-inspection has been developed.

For example, in Patent Document 1, an insulation resistance monitoring device is disclosed. In this insulation resistance monitoring device, the voltage obtained by dividing the voltage by the insulation resistance of the motor and the reference resistance is input to the control unit, the insulation resistance value corresponding to the input voltage is calculated by the calculation unit, and the insulation resistance value of the motor is measured.

PRIOR ART DOCUMENT

Patent Document 1: Japanese Laid-Open Patent Publication No. 2017-173176

SUMMARY OF INVENTION

Problems to be Solved by the Invention

However, even when an insulation resistance monitoring device as in Patent Document 1 is installed, it is necessary to manually measure the insulation resistance to be measured using a mega tester for legal inspection. Also, in the self-inspection, it may be necessary to measure the insulation resistance for each measurement target in order to investigate the cause.

By the way, in the insulation resistance monitoring device as in Patent Document 1, a semiconductor switch such as an FET, etc., is used as a switch for opening and closing a conduction path between the measurement target and the power supply that applies a voltage to the measurement target. Such a switch has a low resistance value of 1 MΩ or less in the off state of the power supply.

Therefore, even if the power of the insulation resistance monitoring device is turned off, if the insulation resistance is measured manually using the mega tester, the current due to the megger voltage of the mega tester will leak to the insulation resistance monitoring device side.

In order to prevent such a situation, it was necessary to remove the insulation resistance monitoring device from the measurement target every time the measurement was performed using the mega tester, which was complicated.

The present invention has been made to solve the above problems, and an object of the present invention is to provide an insulation resistance monitoring device capable of measuring insulation resistance using a mega tester without removing the insulation resistance monitoring device.

Means to Solve Problems

To solve the problem, the present invention provides an insulation resistance monitoring device that monitors an insulation resistance of an object to be measured, the device comprising:

a current detecting unit that is connected between a power supply line and a ground line of the object to be measured and detects a current flowing through the insulation resistance of the object to be measured;

a voltage generating unit that is connected between the power supply line and the ground line of the object to be measured; and a switch that opens and closes a connection path between the power supply line or the ground line of the object to be measured and the voltage generating unit, wherein the switch has an off resistance of 100 MΩ or more when the connection path is opened.

Effect of the Invention

According to the present invention, it is possible to provide an insulation resistance monitoring device that enables measurement of insulation resistance using a mega tester without removing the insulation resistance monitoring device.

DESCRIPTION OF EMBODIMENT

Figure 1:
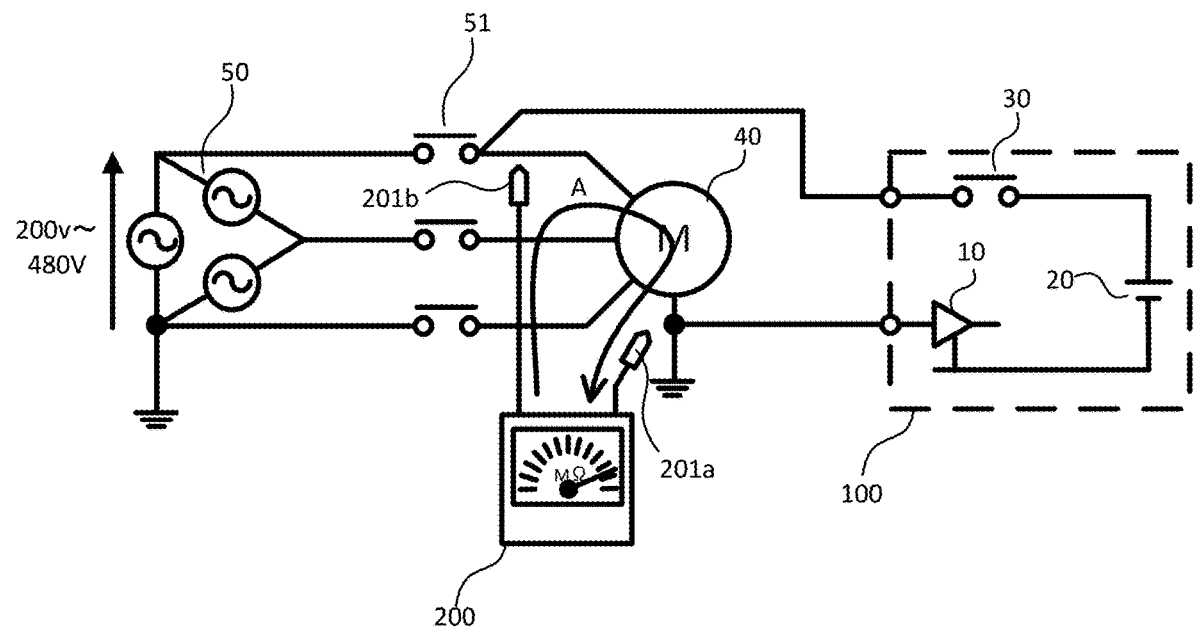
FIG. 1 is a diagram showing a schematic configuration of an insulation resistance monitoring device according to an embodiment of the present invention.

Hereinafter, an embodiment of the present invention will be described in detail with reference to the drawings. FIG. 1 is a diagram showing a schematic configuration of an insulation resistance monitoring device 100 according to the present embodiment. As shown in FIG. 1, the insulation resistance monitoring device 100 includes a current detecting unit 10, a voltage generating unit 20, and a switch 30.

The current detecting unit 10 is composed of an operational amplifier or the like, and is connected between the power supply line and the ground line of the motor 40 as an object to be measured. The current detecting unit 10 detects the current flowing through the insulation resistance of the motor 40. The output part of the current detection unit 10 is provided with a control unit (not shown). The control unit performs an output indicating an abnormality if an insulation resistance value calculated based on the current detected by the current detecting unit 10 is outside the normal value range.

The voltage generating unit 20 is connected between the power supply line and the ground line of the motor 40, and generates a voltage of DC500V or the like when the insulation resistance is measured by the insulation resistance monitoring device 100. The voltage generated by the voltage generating unit 20 is supplied to the motor 40 via the power supply line. Further, when the insulation resistance is not measured by the insulation resistance monitoring device 100, the voltage by the voltage generating unit 20 becomes 0V.

The switch 30 is a switch that opens and closes the connection path between the power supply line or ground line of the motor 40 and the voltage generating unit 20. In the present embodiment, the switch 30 is, for example, a mechanical switch, and the off resistance when the connection path between the power supply line or the ground line of the motor 40 and the voltage generating unit 20 is opened is 100 MΩ. This is because the insulation resistance of the motor 40 is about 100 MΩ. The resistance of the switch 30 can be changed according to the measurement target, and may be 100 MΩ or more, preferably 1000 MΩ or more.

As the switch 30, for example, a reed relay can be used in addition to the mechanical switch.

A voltage of about 200V to 480V is applied to the motor 40 from the three-phase power supply 50. An earth leakage breaker 51 is provided between the three-phase power supply 50 and the motor 40. The three-phase power supply 50 is connected to the output of a switchboard (not shown). The switchboard is connected to a cubicle-type high-voltage power receiving/transforming facility (not shown). From the electric power company, for example, a voltage of 6600V is supplied to the cubicle type high voltage power receiving/transforming equipment, and the voltage supplied to the cubicle type high voltage power receiving/transforming equipment is stepped down to a low voltage of about 200V to 480V by the switchboard provided on each floor, for example.

Figure 2:
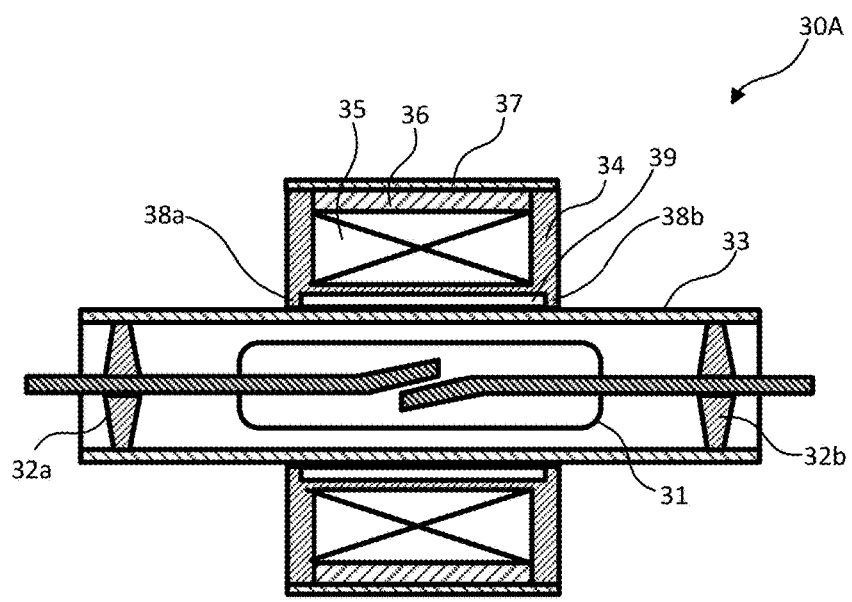
FIG. 2 is a diagram showing a schematic configuration of a reed relay.

FIG. 2 shows an example of a reed relay 30A. The reed relay 30A includes a reed switch 31. The reed switch 31 is a switch in which contacts are sealed in a glass tube or the like, and is held in the electrostatic shield pipe 33 by bushings 32a and 32b made of a highly insulating material. The electrostatic shield pipe 33 is installed in the tubular hollow portion of the coil bobbin 34, and overhangs 38a and 38b are provided at the open end of the hollow portion. The coil bobbin 34 and the electrostatic shield pipe 33 are in contact with each other only by the overhangs 38a and 38b, and a gap 39 is formed between the inner surface of the hollow portion of the coil bobbin 34 and the electrostatic shield pipe 33.

In FIG. 2, overhangs 38a and 38b are provided at both ends of the hollow portion of the coil bobbin 34, but the overhangs 38a and 38b may be arranged inside the hollow portion, and the number of overhangs can be 3 or more.

On the back surface of the coil bobbin 34, the resin 36 is filled after winding the coil 35, and the magnetic shield case 37 is covered so as to cover the coil 35.

In the reed relay 30A as described above, as an example, a highly insulated reed switch having an insulation resistance of $10^{14}$Ω or more is used as the reed switch 31.

Further, the reed switch 31 may be configured so that the contacts do not oxidize by sealing an inert gas in a glass tube or the like.

Specific examples of the reed relay 30A include SL-16212 of Sanei Kogyo Co., Ltd., S8-1204VU of Cynergy3, and 9104-12-10 of Coto Technology.

In the insulation resistance monitoring device 100 of the present embodiment as described above, when the insulation resistance of the motor 40 is measured by the mega tester 200, the connection path is opened by the switch 30. Then, as shown in FIG. 1, the probe 200a of the mega-tester 200 is brought into contact with the ground line of the motor 40, the probe 200b is brought into contact with the power supply line of the motor 40, and then a megger voltage of about 500 V is applied. As a result, a current flows from the power supply line of the motor 40 to the ground line in the direction indicated by the arrow A, and the insulation resistance of the motor 40 can be measured.

In this way, even when a megger voltage of about 500 V is applied to the motor 40 by the megger tester 200, since the off resistance of the switch 30 is 100 MΩ when the switch 30 opens the connection path between the power supply line or the ground line of the motor 40 and the voltage generating unit 20, the current due to the megger voltage does not leak to the insulation resistance monitoring device 100 side.

As a result, according to the present embodiment, it is possible to measure the insulation resistance of the motor 40 using a mega tester without removing the insulation resistance monitoring device 100 from the motor 40.

Comparative Example

Figure 3:
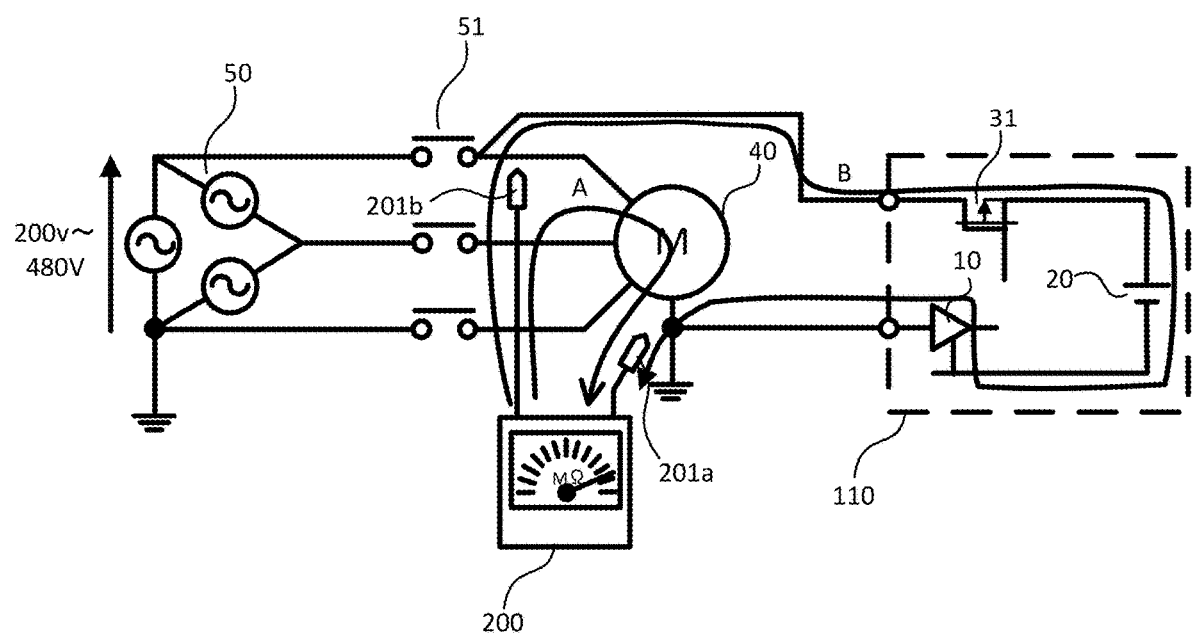
FIG. 3 is a diagram showing a schematic configuration of an insulation resistance monitoring device of a comparative example.

Next, a comparative example compared with the insulation resistance monitoring device 100 of the present embodiment will be described. FIG. 3 is a diagram showing an insulation resistance monitoring device 110 of the comparative example. The insulation resistance monitoring device 110 of the comparative example is different from the insulation resistance monitoring device 100 of the present embodiment in that the switch 31 is composed of a semiconductor switch such as an FET.

In the insulation resistance monitoring device 110 of the comparative example, when the insulation resistance of the motor 40 is measured by the mega tester 200, the connection path is opened by the switch 31. Then, as shown in FIG. 3, the probe 200a of the megger tester 200 is brought into contact with the ground line of the motor 40, the probe 200b is brought into contact with the power supply line of the motor 40, and then a megger voltage of about 500 V is applied. As a result, a current flows from the power supply line of the motor 40 to the ground line in the direction indicated by the arrow A, and the insulation resistance of the motor 40 can be measured.

When a megger voltage of about 500 V is applied to the motor 40 by the megger tester 200 in this way, since the switch 30 in the insulation resistance monitoring device 110 of the comparative example is a semiconductor switch, the off resistance when the connection path between the power supply line or the ground line of the motor 40 and the voltage generating unit 20 is opened is about 1 MΩ. Therefore, when the probes 200a and 200b of the mega tester 200 are brought into contact with the power supply line and the ground line of the motor 40 as described above, the current due to the megger voltage leaks to the insulation resistance monitoring device 110 side as shown by the arrow B in FIG. 3.

Therefore, if the insulation resistance monitoring device 110 of the comparative example is used, it is necessary to remove the insulation resistance monitoring device 110 from the motor 40 when measuring the insulation resistance using the mega tester 200.

As described above, as is clear from the comparison between the insulation resistance monitoring device 100 of the present embodiment and the insulation resistance monitoring device 110 of the comparative example, according to the insulation resistance monitoring device 100 of the present embodiment, The insulation resistance can be measured by the mega tester 200 without removing the insulation resistance monitoring device 100 from the motor 40.

Modification Example

The above embodiment is an example, and various modifications can be made without departing from the scope of the present invention.

In the above-described embodiment, an example in which the measurement target of the insulation resistance is the motor 40 has been described, but the present invention is not limited to such an example. Various loads other than the motor 40 can be measured.

Although the insulation resistance monitoring device according to the embodiment of the present invention has been described in the present specification, the present invention is not limited to this, and various modifications can be made without departing from the gist of the present invention.

EXPLANATIONS OF LETTERS OR NUMERALS 10 current detecting unit
20 voltage generating unit
30 switch
30A reed relay
100 insulation resistance monitoring device

The invention claimed is:

1. An insulation resistance monitoring device for monitoring an insulation resistance of an object to be measured, the insulation resistance monitoring device comprising:
   a current detecting unit that is connected between a power supply line and a ground line of the object to be measured and detects a current flowing through the insulation resistance of the object to be measured;
   a voltage generating unit that is connected between the power supply line and the ground line of the object to be measured; and
   a switch that opens and closes a connection path between the power supply line or the ground line of the object to be measured and the voltage generating unit,
   wherein the switch has an off resistance of 100 MΩ or more when the connection path is opened.

2. The insulation resistance monitoring device according to claim 1, wherein
   the switch has an off resistance of preferably 1000 MΩ or more when the connection path is opened.

3. The insulation resistance monitoring device according to claim 1, wherein
   the switch is a reed relay.

4. The insulation resistance monitoring device according to claim 2, wherein
   the switch is a reed relay.

5. The insulation resistance monitoring device according to claim 1, wherein
   the switch is a mechanical switch.

6. The insulation resistance monitoring device according to claim 2, wherein
   the switch is a mechanical switch.

* * * * *